United States Patent [19]
Wing

[11] Patent Number: 6,021,582
[45] Date of Patent: Feb. 8, 2000

[54] TEMPERATURE CONTROL OF PARYLENE DIMER

[75] Inventor: James Wing, Los Altos, Calif.

[73] Assignee: Novellus Systems, Inc., San Jose, Calif.

[21] Appl. No.: 09/040,328

[22] Filed: Mar. 16, 1998

[51] Int. Cl.[7] .................................................. F26B 17/00
[52] U.S. Cl. .............................................................. 34/576
[58] Field of Search .................................... 118/600, 308, 118/576

[56] References Cited

U.S. PATENT DOCUMENTS 5,538,758  7/1996  Beach et al. ......................... 427/255.6

OTHER PUBLICATIONS

Harrus, et al., "Two Approaches to the Development of Low k Systems; Parylene AF–4, and Flourinated Amorphous Carbon", Electrochemical Society of Japan; The 52nd Symposium on Semiconductors and Integrated Circuits Technology (SSICT), Jun. 1997, 6 pages.

Ralston, et al., "Integration of Thermally Stable, Low–k AF4 Polymer for 0.18 μm Interconnects and Beyond", 1997 Symposium on VLSI Technology, Jun. 10–12, Kyoto, Japan, 2 pages.

*Primary Examiner*—Henry Bennett
*Assistant Examiner*—Malik N. Drake
*Attorney, Agent, or Firm*—Skjerven, Morrill, MacPherson, Franklin & Friel; David E. Steuber

[57] ABSTRACT

An apparatus for vaporizing Parylene AF dimer powder includes a vaporizer having a housing, a cooling coil surrounding the housing and an isolation valve coupled to an outlet end of the housing. During use, the vaporizer and a valve and manifold assembly coupled to the vaporizer are heated by an oven. The Parylene AF dimer powder inside of the vaporizer is initially maintained below its sublimation temperature by flowing a cooling fluid through the cooling coil while the oven heats up. After the oven and valve and manifold assembly reach the operating temperature, the cooling fluid flow is decreased and correspondingly the vaporizer temperature increased thus producing Parylene AF4 dimer vapor.

21 Claims, 3 Drawing Sheets

TEMPERATURE CONTROL OF PARYLENE DIMER

FIELD OF THE INVENTION

The present invention relates generally to a method and apparatus for vaporizing solid materials. More particularly, the present invention relates to a method and apparatus for vaporizing Parylene AF4 dimer powder.

BACKGROUND OF THE INVENTION

As feature size in the IC industry continues to decrease, practical and reliable low dielectric constant materials become increasingly important.

One dielectric material which is often used is silicon dioxide. Silicon dioxide is typically selected because it has good physical and electric properties. For example, silicon dioxide has good mechanical stability at elevated temperatures and typically has a dielectric constant in the range of 4 to 5. However, as the art moves towards faster and lower power applications, it is desirable to produce a dielectric material with a dielectric constant of 3 or less.

One promising dielectric material with a dielectric constant less than 3 is Parylene AF4. Parylene AF4 is a parylene coating derived from di-para-xylylene ("Parylene AF4 Dimer," available from Specialty Coating Systems, Inc. located in Indianapolis, Ind.). As set forth in Beach et al., U.S. Pat. No. 5,538,758, (hereinafter Beach et al.), incorporated herein by reference in its entirety, thin film Parylene AF4 is obtained by a well known process in which the Parylene AF4 dimer is vaporized, pyrolized and then fed into a deposition chamber wherein the Parylene AF4 is deposited on the substrate.

To vaporize the Parylene AF4 dimer, Beach et al. teach that the powdered Parylene AF4 dimer is placed in a dimer crucible and heat transfer receptacle. Electrical heating elements are then used to heat the heat transfer receptacle thereby vaporizing the Parylene AF4 dimer powder. However, once vaporized, the Parylene AF4 dimer vapor has a tendency to condense as solid Parylene AF4 dimer on the inner walls of several areas of the apparatus. This undesirable condensation of Parylene AF4 dimer vapor reduces the cost effectiveness of forming the Parylene AF4 thin film and also contaminates the apparatus. Accordingly, the art needs a method of vaporizing Parylene AF4 dimer which avoids the waste and expense resulting from Parylene AF4 dimer vapor condensation and the associated system contamination.

To avoid the undesirable accumulation of solid Parylene AF4 dimer, Beach et al. teach providing independent heating elements to heat the various parts of the apparatus which contact the Parylene AF4 dimer vapor. However, these independent heating elements unevenly heat the various parts of the apparatus resulting in temperature differentials and localized cold spots. As a result, condensation of the Parylene AF4 dimer vapor inevitably occurs.

Beach et al. teach that the heat transfer receptacle can be cooled to reduce or quench vaporization of the Parylene AF4 dimer powder. However, as set forth above, solid Parylene AF4 dimer powder accumulates on various parts of the apparatus, and these parts are heated. Consequently, even when the heat transfer receptacle is cooled, significant Parylene AF4 dimer powder vaporization continues from the other heated parts of the apparatus. Further, even when the heat transfer receptacle is heated to produce Parylene AF4 dimer vapor, the contribution from the other heated parts of the apparatus to the total Parylene AF4 dimer vapor flow is unpredictable. Thus, the apparatus of Beach et al. is not well suited for producing a stable and controllable flow of Parylene AF4 dimer vapor.

Uncontrollability of the Parylene AF4 dimer vapor flow in turn results in uncontrollability of the deposited thin film Parylene AF4 thickness. For example, if the Parylene AF4 dimer vapor flow is higher than expected, then the resulting Parylene AF4 film will be too thick. Thus, the apparatus of Beach et al. is not well suited for semiconductor type process applications where repeatable controlled deposition of thin films is required. Accordingly, the art needs a method of producing a stable and controllable flow of Parylene AF4 dimer vapor. The method should also be relatively simple to allow implementation in a manufacturing environment.

SUMMARY OF THE INVENTION

In accordance with the present invention, an apparatus for vaporizing Parylene AF dimer powder includes a vaporizer having a housing, a cooling coil surrounding the housing and an isolation valve coupled to an outlet end of the housing.

During use, the Parylene AF4 dimer powder is placed inside of the housing of the vaporizer. A flow of a cooling fluid, e.g. nitrogen gas or air, is then initiated through the cooling coil. The vaporizer and a valve and manifold assembly connected to the vaporizer are then heated by an oven, the vaporizer and the valve and manifold assembly being located in the oven.

The flow of cooling fluid through the cooling coil maintains the vaporizer temperature below the sublimation temperature of the Parylene AF dimer powder and thus vaporization does not occur. However, the valve and manifold assembly is uniformly heated to the operating temperature of the oven which is greater than the sublimation temperature of the Parylene AF4 dimer powder. In this manner, temperature nonuniformity and localized cold spots in the valve and manifold assembly are avoided.

The flowrate of the cooling fluid through the cooling coil is then reduced and consequently the vaporizer temperature increases. The vaporizer temperature continues to increase above the sublimation temperature of the Parylene AF4 dimer powder and thus Parylene AF dimer vapor is produced.

Advantageously, the valve and manifold assembly is heated to a temperature sufficient to prevent condensation of the Parylene AF4 dimer vapor before the vaporizer temperature becomes sufficient to create any Parylene AF4 dimer vapor. This eliminates any possible condensation of the Parylene AF dimer vapor in the valve and manifold assembly thus avoiding waste of the relatively expensive Parylene AF4 dimer and contamination of the valve and manifold assembly.

After the charge of Parylene AF4 dimer powder in the vaporizer is nearly exhausted, the flowrate of the cooling fluid through the cooling coil is again increased. Consequently, the vaporizer temperature decreases to a temperature below the sublimation temperature of the Parylene AF4 dimer powder. After the vaporizer temperature decreases, the oven is turned off. Correspondingly, the temperature of the valve and manifold assembly drops.

Advantageously, the vaporizer temperature is reduced and Parylene AF4 dimer vapor production is ceased before the valve and manifold assembly is cooled. This avoids condensation of the Parylene AF4 dimer vapor in the valve and manifold assembly.

These and other objects, features and advantages of the present invention will be more readily apparent from the

DETAILED DESCRIPTION

Figure 1:
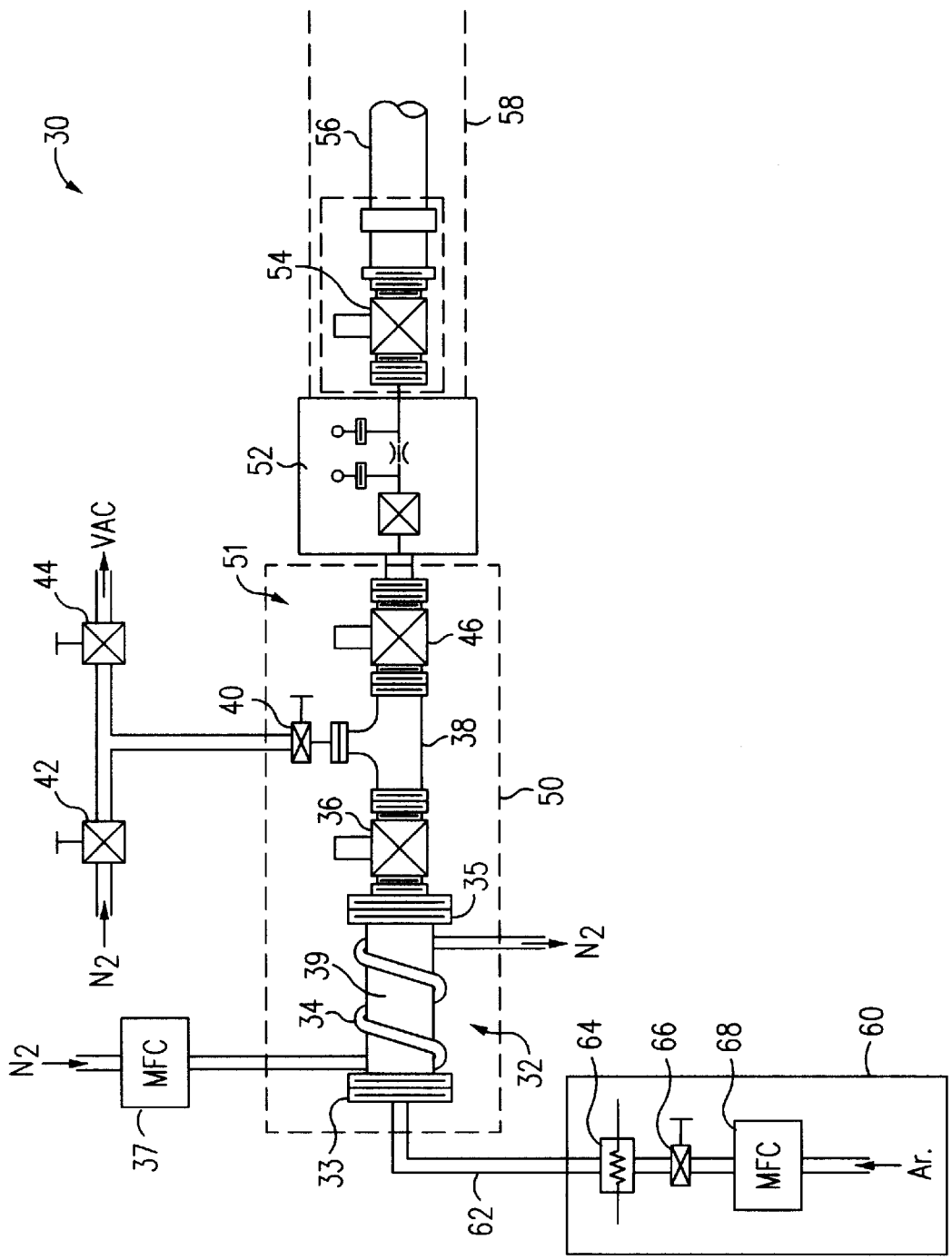
FIG. 1 is a schematic diagram of a Parylene AF4 dimer vacuum vaporization system in accordance with one embodiment of the present invention.

FIG. 1 is a schematic diagram of a Parylene AF4 dimer vacuum vaporization system 30 in accordance with one embodiment of the present invention. System 30 includes a cylindrical vaporizer 32 having a housing 39 and a removable end 33. End 33 can be removed to allow Parylene AF4 dimer powder to be loaded into vaporizer 32. A cooling coil 34, comprising a tube, is in physical contact with the outer surface of housing 39 of vaporizer 32. During use, a suitable cooling fluid, e.g. nitrogen gas or air, flows through cooling coil 34 cooling vaporizer 32 and thereby preventing (or stopping) vaporization of the Parylene AF4 dimer powder as described further below.

Cooling coil 34 is coupled to a conventional mass flow controller 37 which controls the flow of cooling fluid to cooling coil 34. Alternatively, instead of employing mass flow controller 37 (which is relatively expensive), a high flowrate valve and a low flowrate valve (not shown) coupled in parallel to coiling coil 34 can be used. By selectively opening the high or low flowrate valve, a high or low flowrate of cooling fluid is provided to cooling coil 34 thereby significantly or slightly cooling vaporizer 32, respectively, as described further below.

Vaporizer 32 is connected on a second end 35, opposite end 33, to an isolation valve 36. Isolation valve 36 can be shut to isolate vaporizer 32 from the rest of system 30. Isolation valve 36 is connected to a T-fitting 38. T-fitting 38 is also connected to valves 40, 46. Valve 40 is in turn connected to valves 42, 44 which are respectively coupled to sources of an inert purge gas, e.g. nitrogen or argon, and vacuum. All connections between the various components of dimer vaporization system 30 are made using conventional vacuum technology. Further, the temperature and pressure at various locations in dimer vacuum vaporization system 30 can be measured using conventional techniques, e.g. with thermocouples and capacitance manometers.

Vaporizer 32, cooling coil 34, valves 36, 40, 46 and T-fitting 38 are enclosed by a conventional oven 50. Valve 46 is coupled to a heated mass flow controller 52, e.g. a MKS1153 mass flow controller, which is located outside of oven 50. During use, mass flow controller 52 monitors and controls the flowrate of the Parylene AF4 dimer vapor. Mass flow controller 52 has an internal heater which keeps the wetting surfaces (the surfaces which contact the Parylene AF4 dimer vapor) at an elevated temperature. This elevated temperature is sufficient to prevent the Parylene AF4 dimer vapor from condensing on the wetted surfaces yet is less than a temperature at which the Parylene AF4 dimer vapor is pyrolized or otherwise chemically altered, e.g. the elevated temperature is 200° C. It is understood that other devices besides a mass flow controller can be used to monitor and control the flowrate of the Parylene AF4 dimer vapor. For example, a variable or fixed orifice can be used to control the flowrate and the pressure drop across this orifice can be measured to monitor the flowrate.

Mass flow controller 52 is also coupled to a second valve 54 located inside of an oven 58. Valve 54 is coupled to a conventional pyrolizer zone 56 and generally to the reaction chamber (pyrolizer zone 56 is shown as a cut-off in FIG. 1 for clarity and extends to the pyrolizer (not shown) wherein the Parylene AF4 dimer is pyrolized). Since valve 54 and pyrolizer zone 56 are located inside of oven 58, valve 54 and pyrolizer zone 56 are maintained at an elevated temperature. This elevated temperature is sufficient to prevent the Parylene AF4 dimer vapor from condensing yet is less than a temperature of which the Parylene AF4 dimer is pyrolized or otherwise chemically altered, e.g. the elevated temperature is 200° C. Generally, valve 54, pyrolizer zone 56 and the wetted surfaces of mass flow controller 52 are maintained at the same or similar elevated temperature.

Dimer vacuum vaporization system 30 vaporizes Parylene AF4 dimer powder as follows. Initially, all parts are at room temperature, end 33 is removed and Parylene AF4 dimer powder is inserted into vaporizer 32. End 33 is then resealed, valves 36, 40, 42, 44, 46 and 54 being closed during loading of the Parylene AF4 dimer powder. Then valves 36, 40 and 44 are opened thereby evacuating vaporizer 32 (and T-fitting 38) to a subatmospheric pressure, e.g. less than one torr. Vaporizer 32 and the various vacuum connections can be leak checked at this time. The pressure inside vaporizer 32 is hereinafter referred to as the dimer pressure. Valves 40 and 44 are then closed, the dimer pressure remaining at a subatmospheric pressure.

Figure 2:
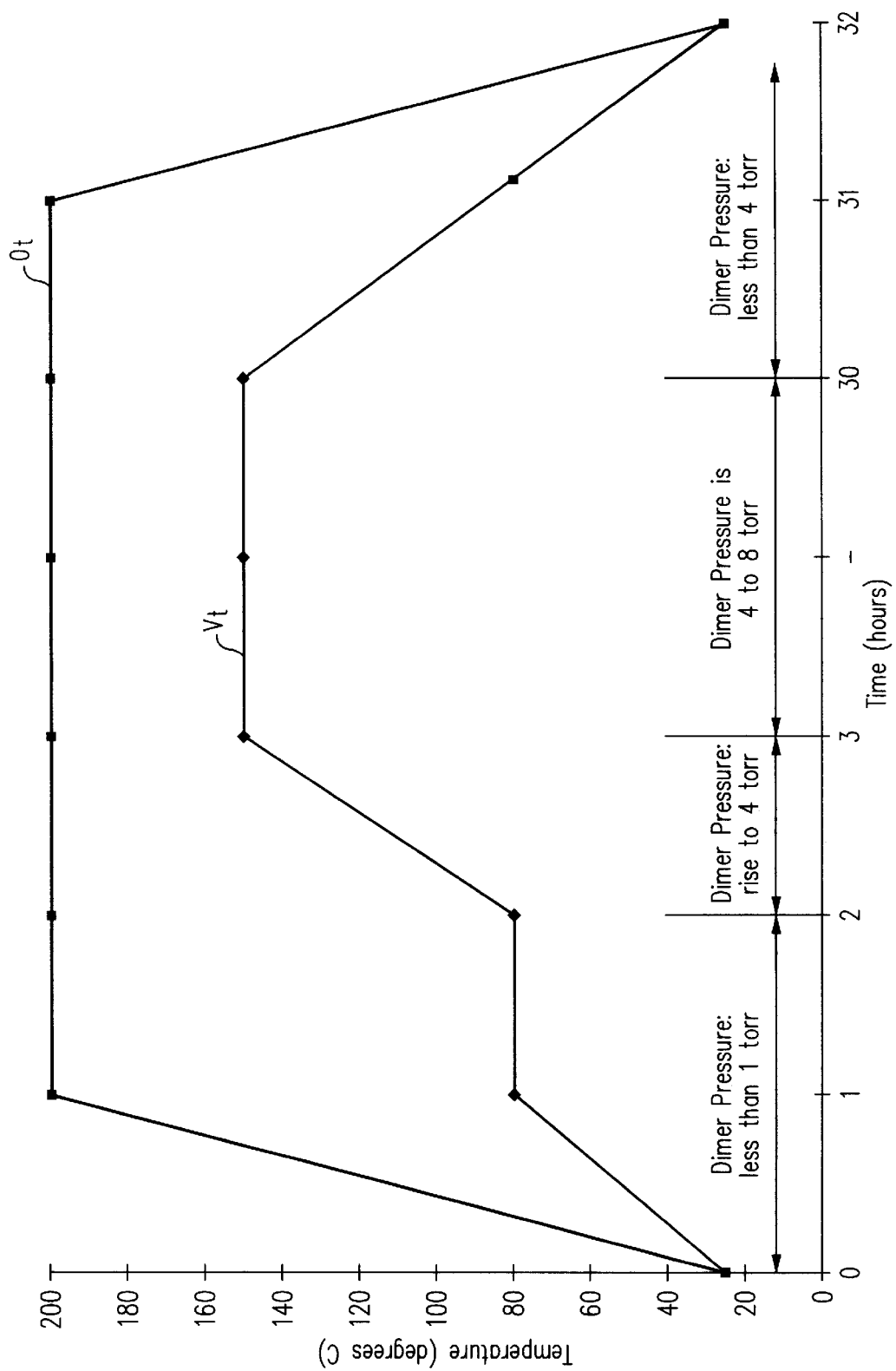
FIG. 2 is a graph of temperature vs. time of various components of the dimer vacuum vaporization system of FIG. 1 in accordance with the present invention.

FIG. 2 is a graph of temperature vs. time of various components of the dimer vacuum vaporization system 30 of FIG. 1 in accordance with the present invention. Referring to FIGS. 1 and 2, curve Ot represents the temperature inside of oven 50 generally and more particularly of valves 36, 40, 46 and T-fitting 38 (hereinafter referred to as oven temperature Ot). Curve Vt represents the temperature of vaporizer 32 and the Parylene AF4 dimer powder inside of vaporizer 32 (hereinafter referred to as vaporizer temperature Vt). As shown by FIG. 2, at time T=0 hours (hrs.), both oven temperature To and vaporizer temperature Vt are approximately equal to the room temperature of approximately 25° C. At time T=0 hrs., oven 50 is turned on and a high flow of cooling fluid through cooling coil 34 is initiated.

Between time T=0 hrs. and 1 hrs., oven temperature Ot linearly increases from room temperature to the setpoint oven temperature of approximately 200° C. Generally, the setpoint oven temperature (or operating oven temperature) is greater than the sublimation temperature of the Parylene AF4 dimer powder (the sublimation temperature is in the approximate range of 140° C. to 180° C. at a dimer pressure of about 8 torr) but less than the temperature at which the Parylene AF4 dimer vapor is pyrolized or otherwise chemically changed (generally less than 215° C.)

During this same time period, i.e. between time T=0 hrs. and 1 hrs., vaporizer temperature Vt also linearly increases from room temperature to approximately 80° C. due to heating from oven 50. However, vaporizer temperature Vt remains well below oven temperature Ot due to the cooling effect of the cooling fluid flowing through cooling coil 34. Of importance, vaporizer temperature Vt remains below the sublimation temperature of the Parylene AF4 dimer powder thus preventing vaporization of the Parylene AF4 dimer powder. Further, since the Parylene AF4 dimer powder does not sublime, the dimer pressure remains at less than one torr.

Between time T=1 hrs. and 2 hrs., oven temperature Ot and vaporizer temperature Vt are allowed to stabilize. Of importance, this ensures that the valve and manifold assembly 51 inside of oven 50, i.e., valves 36, 40, 46 and T-fitting 38, are uniformly heated to oven temperature Ot and temperature differentials and localized cold spots in assembly 51 are avoided. It is understood that assembly 51 including valves 36, 40, 46 and T-fitting 38 is illustrative and that other combinations of various components can be used to form assembly 51.

At time T=2 hrs., the flow of cooling fluid through cooling coil 34 is reduced. As a result, vaporizer temperature Vt linearly increases to approximately 150° C. at time T=3 hrs. Generally, vaporizer temperature Vt increases to a temperature above the sublimation temperature of the Parylene AF4 dimer powder but at or below oven temperature Ot. This increase in vaporizer temperature Vt causes the Parylene AF4 dimer powder to sublimate into Parylene AF4 dimer vapor. Correspondingly, the dimer pressure rises to the working pressure for proper operation of the depositions system, generally at least approximately 4 torr (the vapor pressure of the Parylene AF4 dimer at vaporizer temperature Vt determines the pressure inside of vaporizer 32, i.e. determines the dimer pressure).

Of importance, assembly 51 is uniformly heated to a temperature sufficient to prevent condensation of the Parylene AF4 dimer vapor before vaporizer temperature Vt becomes sufficient to create any Parylene AF4 dimer vapor. This eliminates any possible condensation of the Parylene AF4 dimer vapor in assembly 51 thus avoiding waste of the relatively expensive Parylene AF4 dimer and contamination of assembly 51. Further, as described above, wetting surfaces of mass flow controller 52, valve 54, and pyrolizer zone 56 are continuously maintained at a temperature sufficient to prevent condensation of the Parylene AF4 dimer vapor, e.g. at 200° C.

In contrast, if vaporizer 32 was not cooled during ramp-up of oven 50, i.e. if vaporizer 32 was heated along with assembly 51, then Parylene AF4 dimer vapor would be produced before the various components of assembly 51 attained thermal equilibrium with oven 50. This would undesirably result in the parylene AF4 dimer vapor contacting and condensing on localized cold spots of assembly 51.

Referring again to FIG. 2, between time T=3 hrs. to 30 hrs., oven temperature Ot and vaporizer temperature Vt remain constant at approximately 200° C. and 150° C., respectively. Vaporizer temperature Vt remains well below oven temperature Ot due to the cooling effect of the cooling fluid flow through cooling coil 34. The dimer pressure also remains at a pressure at least approximately equal to 4 torr, e.g. between 4 torr and 8 torr.

During this time period, i.e. between time T=3.0 hrs. and 30 hrs., valves 36, 46 and 54 are open and Parylene AF4 dimer vapor flows from vaporizer 32, through valve 36, T-fitting 38, valve 46, mass flow controller 52, valve 54 and pyrolizer zone 56 and into the pyrolizer (not shown). Mass flow controller 52 measures and controls the flow of the Parylene AF4 dimer vapor as is well known to those skilled in the art. The Parylene AF4 dimer vapor can be sampled, e.g. to monitor for contaminants, by diverting a portion of the Parylene AF4 dimer vapor to a sampling unit. In one embodiment (not shown), a fourier transform infrared spectrometer (FTIR) is coupled to pyrolizer zone 56 and samples a portion of the Parylene AF4 dimer vapor before the vapor enters the Pyrolizer.

Illustratively, approximately 1.0 kilogram of Parylene AF4 dimer powder is used to provide a flow of Parylene AF4 dimer vapor to the pyrolizer between time T=3.0 hrs and 30 hrs. Advantageously, this allows continuous deposition of Parylene AF4 on a substrate(s) over an extended period of time, i.e. for approximately 27 hrs. Further, by employing two dimer vacuum vaporization systems 30 in parallel, one of the systems can always be on line providing Parylene AF4 dimer vapor while the other system is being cooled, recharged with Parylene AF4 dimer powder, and reheated. This allows continuous deposition of Parylene AF4 for an infinite period of time.

Advantageously, the dimer pressure in vaporizer 32 is constant regardless of whether valve 36 is open or closed. This insures a stable and controllable flow of Parylene AF4 dimer vapor even if the flow of the Parylene AF4 dimer vapor is temporarily interrupted by opening and closing valve 36 (e.g. during substrate replacement). Thus, dimer vacuum vaporization system 30 is well suited for continuous processing (e.g. semiconductor type process applications), wherein reliable, stable and controllable flows of parylene AF4 dimer vapor are provided over a wide range of operating conditions and over an extended period of time. This is in contrast to the apparatus of Beach et al., described above, which is generally suited for batch type processing wherein each batch of substrates is coated from a single charge of Parylene AF4 dimer powder and a new change of Parylene AF4 dimer powder must be loaded to process further batches.

Referring still to FIGS. 1 and 2, when dimer powder begins to run low, at about time T=30 hrs., valves 36 and 46 are closed to shut off the flow of Parylene AF4 dimer vapor. Further, the flow of cooling fluid to cooling coil 34 is increased to cool vaporizer 32. This results in a linear decrease in vaporizer temperature Vt from about 150° C. at time T=30 hrs. to about 80° C. at time T=31 hrs. As vaporizer temperature Vt approaches 80° C., sublimation of the Parylene AF dimer powder ceases and correspondingly the dimer pressure also decreases to a pressure less than approximately four torr.

At time T=31 hrs., oven 50 is turned off and correspondingly oven temperature Ot linearly decreases to room temperature at time T=32 hrs. As oven 50 cools, vaporizer 32 also further cools from approximately 80° C. at time T=31 hrs. to room temperature at time T=32 hrs. Advantageously, vaporizer 32 is cooled and Parylene AF dimer vapor production ceased before assembly 51 is cooled thus avoiding condensation of the Parylene AF4 dimer vapor in assembly 51. In contrast, if vaporizer 32 was not cooled before assembly 51 was cooled, i.e. if vaporizer 32 and assembly 51 were cooled together, differential cooling would cause the temperature of various portions of assembly 51 to drop below the sublimation temperature of the Parylene AF4 dimer before the parylene AF4 dimer vapor production ceased. This would undesirably result in Parylene AF dimer vapor condensation on cold spots of assembly 51.

Referring again to FIG. 1, valves 36, 46 and 40 are closed while vaporizer 32, assembly 51 and oven 50 cool. As those skilled in the art will understand, valve 40 is then opened and valves 42, 44 are selectively opened and closed to vent and purge T-fitting 38 of any remaining vapor. It is understood that valves 36, 46, 54 and mass flow controller 52 can also be manipulated to further vent and purge other components of dimer vacuum vaporization system 30. Valve 36 is then closed thus allowing end 33 to be removed and additional Parylene AF4 dimer powder to be loaded into vaporizer 32.

Referring still to FIG. 1, dimer vacuum vaporizer system 30 can optionally include an carrier gas unit 60. Carrier gas unit 60 is coupled to end 33 of vaporizer 32 by a conduit 62, e.g. a tube. Carrier gas unit 60 includes a resistive heating element 64, a valve 66 and a mass flow controller 68 (valve 66 provides a positive shutoff to the carrier gas). During operation, a flow of a carrier gas, e.g. an inert gas such as argon, is monitored and controlled by mass flow controller 68 which is coupled to the source of the carrier gas. The carrier gas then flows through valve 66 and to heating element 64. Heating element 64 preheats the carrier gas before the carrier gas flows through conduit 62 (which is also typically heated) and into vaporizer 32. The carrier gas assists the Parylene AF4 dimer vapor in flowing from vaporizer 32 and into the pyrolizer (not shown).

Figure 3:
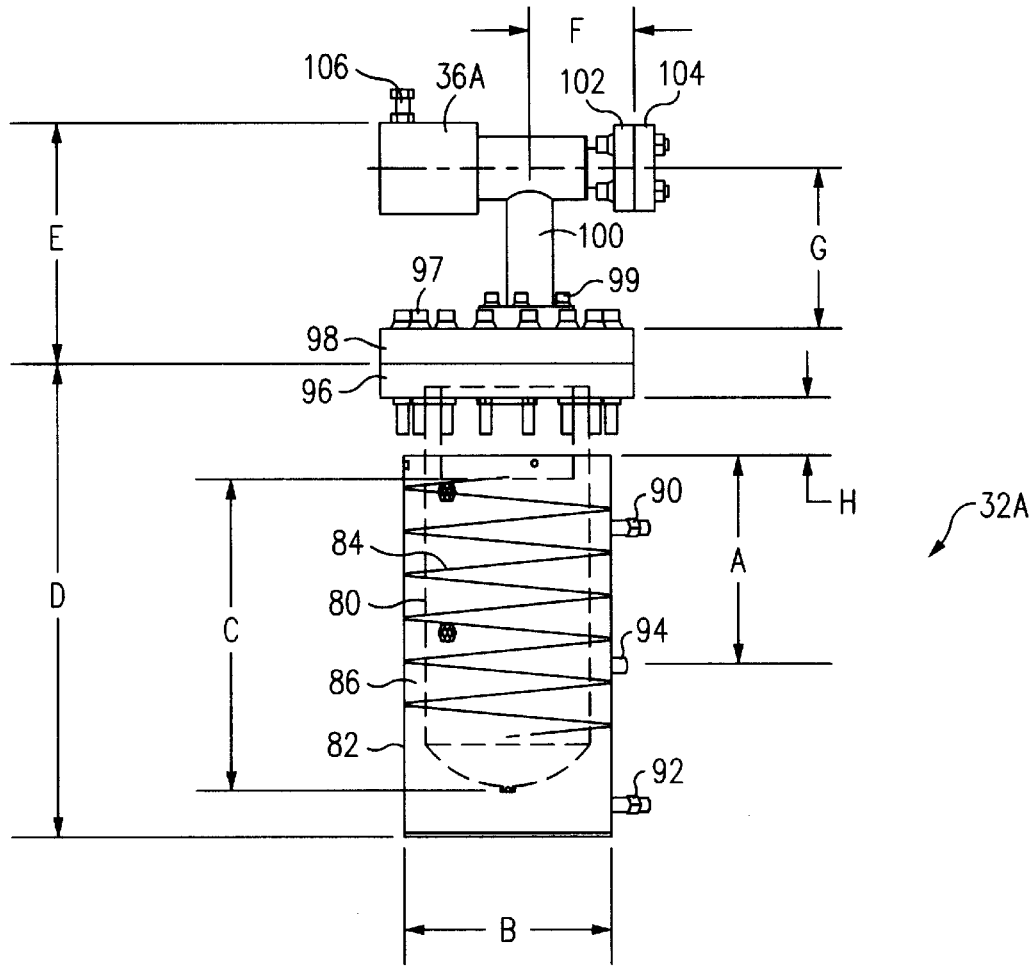
FIG. 3 is a side plan view, partially cutaway, of a vaporizer and isolation valve for use in a dimer vacuum vaporization system in accordance with an alternative embodiment of the present invention.

FIG. 3 is a side plan view, partially cutaway, of a vaporizer 32A and isolation valve 36A for use in a dimer vacuum vaporization system in accordance with an alternative embodiment of the present invention. Vaporizer 32A includes an inner housing 80 (indicated in dashed lines) and an outer housing 82, both formed of a thermally conductive material such as stainless steel. Outer housing 82 is sealed at a top portion thereof to inner housing 80, e.g. with an O-ring. During use, Parylene AF4 dimer powder is located inside of inner housing 80. Located between inner housing 80 and outer housing 82 is a flat divider 84 (similar in shape to a flat spring).

Divider 84 in cooperation with inner housing 80 and outer housing 82 defines a spiral rectangular cooling coil 86. Outer housing 82 includes a cooling fluid inlet 90 and a cooling fluid outlet 92 which allow a cooling fluid, e.g. nitrogen gas or air, to pass in and out of outer housing 82 and through cooling coil 86. More particularly, cooling fluid is introduced into the top of cooling coil 86 through inlet 90. The cooling fluid then travels through cooling coil 86 and finally exits cooling coil 86 and vaporizer 32 through outlet 92. Advantageously, the cooling fluid direct contacts the housing which contains the Parylene AF4 dimer powder (i.e. inner housing 80) providing a faster cooldown of vaporizer 32A and a higher cooling efficiency of the cooling fluid. Vaporizer 32A is also provided with a thermocouple 94 which allows vaporizer temperature Vt to be monitored.

Inner housing 80 is attached, typically welded to an outlet end 96 (a flange). End 96 is in turn attached to a removable cover (also a flange) by bolts 97. A vapor conduit 100 is attached to cover 98 with bolts 99 and thereby to end 96. Conduit 100 extends from cover 98 to isolation valve 36A. Isolation valve 36A is an air actuated valve having a flanged output port 102.

To load Parylene AF4 dimer powder into vaporizer 32A, cover 98 is unbolted and removed from end 96 thereby exposing the cavity defined by inner housing 80. Parylene AF4 dimer powder is then directly placed inside of inner housing 80. Cover 98 is then replaced and rebolted to end 96. The Parylene AF4 dimer powder can be reloaded into the vaporizer at the processor's facility or, alternatively, the empty vaporizer can be returned to the dimer supplier for reloading.

Vaporizer 32A in FIG. 3 is shown as a unit ready for shipment. More particularly, output port 102 of isolation valve 36A is sealed with blank 104. Thus the Parylene AF4 dimer powder (or residue) is fully contained and vaporizer 32A can be shipped without any fear of leakage.

Referring now to FIGS. 1 and 3, once received by the processor, vaporizer 32A is simply placed into oven 50. To complete installation of vaporizer 32A, a compressed air line is connected to port 106 of isolation valve 36A, blank 104 is removed and output port 102 is bolted to T-fitting 38, thermocouple 94 is connected to a thermocouple lead, and inlet 90 and outlet 92 are connected to a source of cooling fluid and a cooling fluid receiver (typically a vent), respectively. Oven 50 is provided with the appropriate feedthroughs. Typically, the dimer supplier evacuates vaporizer 32A before shipment thus eliminating the need to pump down vaporizer 32A after installation and the associated risk of displacement of the Parylene AF4 dimer powder into assembly 51. Thus, installation and removal of vaporizer 32A is relatively simple. Further, by having vaporizer 32A recharged by the dimer supplier, potential exposure of the processor's technicians to the Parylene AF4 dimer is reduced.

Figure 4:
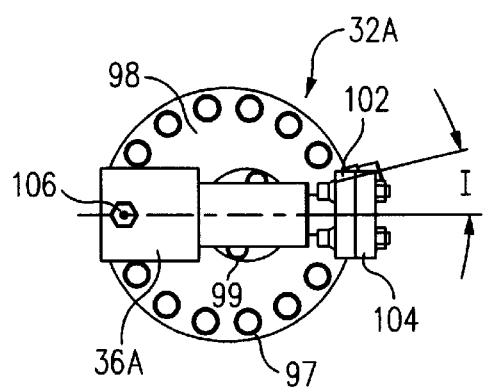
FIG. 4 is a top plan view of the vaporizer and isolation valve of FIG. 3.

FIG. 4 is a top plane view of vaporizer 32A and isolation valve 36A of FIG. 3 in accordance with this embodiment of the present invention. Illustrative specifications for the various characteristics shown in FIGS. 3 and 4 are provided in Table 1 below.

TABLE 1

| CHARACTERISTIC | SPECIFICATION |
| --- | --- |
| A | 4.91 ± .10 in. |
| B | 5.00 in. Max. |
| C | 7.13 in. dimer volume |
| D | 10.78 in. max |
| E | 5.54 in. max |
| F | 2.52 in. |
| G | 3.66 in. |
| H | 1.18 ± .10 |
| I | 15° |

Referring to FIGS. 2 and 3, for vaporizer 32A, vaporizer temperatures Vt of 80° C. and 160° C. are attained at flowrates of 160 liters per minute (LPM) and 20 LPM, respectively, of nitrogen gas having an inlet temperature of approximately 25° C. (room temperature). More particularly, at time T=0 to 2 hrs., 2 to 30 hrs. and 30 to 32 hrs., the flowrate of nitrogen gas is 160 LPM, 20 LPM and 160 LPM, respectively. Although particular flowrates are set forth, it is understood that different flowrates can be used depending upon the particular application and vaporizer temperature Vt desired. Generally, an increase (decrease) in flowrate corresponds to a decrease (increase) in vaporizer temperature Vt.

Having thus described various embodiments, persons skilled in the art will recognize that changes may be made in form and detail without departing from the spirit and scope of the invention. For example, although vaporization of Parylene AF4 dimer powder is described above, it is understood that other materials and/or other Parylene dimers can be vaporized. Further, although some specific parameters such as operating temperatures, pressures, flowrates are set forth above, it is understood that these parameters are only illustrative and other parameters can be used depending upon the specific application and material being vaporized.

In addition, although only a single oven 50 (FIG. 1) is used to heat vaporizer 32 and assembly 51, more than one oven can be used. Referring to FIG. 1, in one embodiment (not shown), a first oven is used to heat vaporizer 32 and isolation valve 36 and a second oven is used to heat T-fitting 38, valves 40, 46 and/or mass flow controller 52, valve 54, pyrolizer zone 56 or various combinations of the above.

When using multiple ovens, it is important that no thermal gaps exist between ovens (i.e., no thermal gaps exist between temperature zones). Thus, the invention is limited only by the following claims.

I claim:

1. An apparatus for producing a vapor from a source material comprising:
   a vaporizer comprising a first housing, said first housing having an outlet end;
   a cooling coil surrounding said first housing;
   an isolation valve coupled to said outlet end of said first housing; and
   a heater element adapted to heat both said vaporizer and said isolation valve.

2. The apparatus of claim 1 further comprising:
   a second housing; and
   a divider between said first housing and said second housing, wherein said first housing; said second housing and said divider define said cooling coil.

3. The apparatus of claim 2 wherein said second housing comprises a cooling fluid inlet and a cooling fluid outlet.

4. The apparatus of claim 2 wherein said second housing is sealed at a top portion thereof to said first housing.

5. The apparatus of claim 1 further comprising a thermocouple to monitor the temperature of said vaporizer.

6. The apparatus of claim 1 further comprising a removable cover removably attached to said outlet end, said isolation valve being attached to said removable cover and thereby to said outlet end.

7. The apparatus of claim 1 further comprising a vapor conduit coupled to said isolation valve and said removable cover.

8. The apparatus of claim 7 wherein said isolation valve comprises an output port, said apparatus further comprising a blank to seal said output port.

9. The apparatus of claim 1 wherein said cooling coil comprises a tube in physical contact with an outer surface of said first housing.

10. The apparatus of claim 1 further comprising a mass flow controller coupled to said cooling coil, said mass flow controller for controlling a flow of cooling fluid through said cooling coil.

11. The apparatus of claim 1 further comprising at least one valve coupled to said cooling coil, said at least one valve for controlling a flow of cooling fluid through said cooling coil.

12. The apparatus of claim 1 wherein said vaporizer in coupled to a valve and manifold assembly.

13. The apparatus of claim 12 further comprising an oven, said vaporizer and said valve and manifold assembly being in said oven.

14. The apparatus of claim 1 further comprising a mass flow controller for controlling a flowrate of said vapor.

15. The apparatus of claim 1 further comprising a carrier gas unit for providing a carrier gas to said vaporizer.

16. The apparatus of claim 15 wherein said carrier gas unit comprises a carrier gas heater for heating said carrier gas.

17. The apparatus of claim 15 wherein said carrier gas unit comprises a mass flow controller for controlling a flowrate of said carrier gas.

18. The apparatus of claim 1 further comprising a vacuum valve for connection to a vacuum source and a purge valve for connection to an inert gas source.

19. The apparatus of claim 1 wherein said heater element comprises an oven surrounding said vaporizer and said isolation valve.

20. The apparatus of claim 19 wherein a valve and manifold assembly is contained within said oven and coupled to said vaporizer.

21. The apparatus of claim 20 further comprising a mass flow controller for controlling the flow rate of said vaporizer.

* * * * *